United States Patent [19]
Park

[11] Patent Number: 5,406,101
[45] Date of Patent: Apr. 11, 1995

[54] HORIZONTAL CHARGE COUPLED DEVICE

[75] Inventor: Heung J. Park, Seoul, Rep. of Korea

[73] Assignee: Goldstar Electron Co., Ltd., Rep. of Korea

[21] Appl. No.: 75,949

[22] Filed: Jun. 11, 1993

[30] Foreign Application Priority Data

Jun. 11, 1992 [KR] Rep. of Korea ............... 10135/1992

[51] Int. Cl.⁶ ............................................. H01L 29/78
[52] U.S. Cl. .................................. 257/249; 257/236; 257/248
[58] Field of Search ............... 257/215, 216, 236, 246, 257/248, 249, 225

[56] References Cited

U.S. PATENT DOCUMENTS

| | | | |
|---|---|---|---|
| 3,943,545 | 3/1976 | Kim | 257/249 |
| 4,001,861 | 1/1977 | Carnes | 257/249 |
| 4,132,903 | 1/1979 | Graham | 257/248 |
| 4,206,372 | 6/1980 | Levine | 257/249 |

*Primary Examiner*—Ngân V. Ngô
*Attorney, Agent, or Firm*—Faegre & Benson

[57] ABSTRACT

A signal charge transfer device. The device comprises a well of a first conductivity type, a channel region of a second conductivity type formed on the well, and a gate insulation film formed on the channel region. A plurality of equally spaced first charge transfer electrodes of the second conductivity type are formed on the gate insulation film. A plurality of second charge transfer electrodes of the first conductivity type are formed between the plurality of first charge transfer electrodes. An insulation film electrically isolates the plurality of first charge transfer electrodes from the plurality of second charge transfer electrodes.

5 Claims, 2 Drawing Sheets

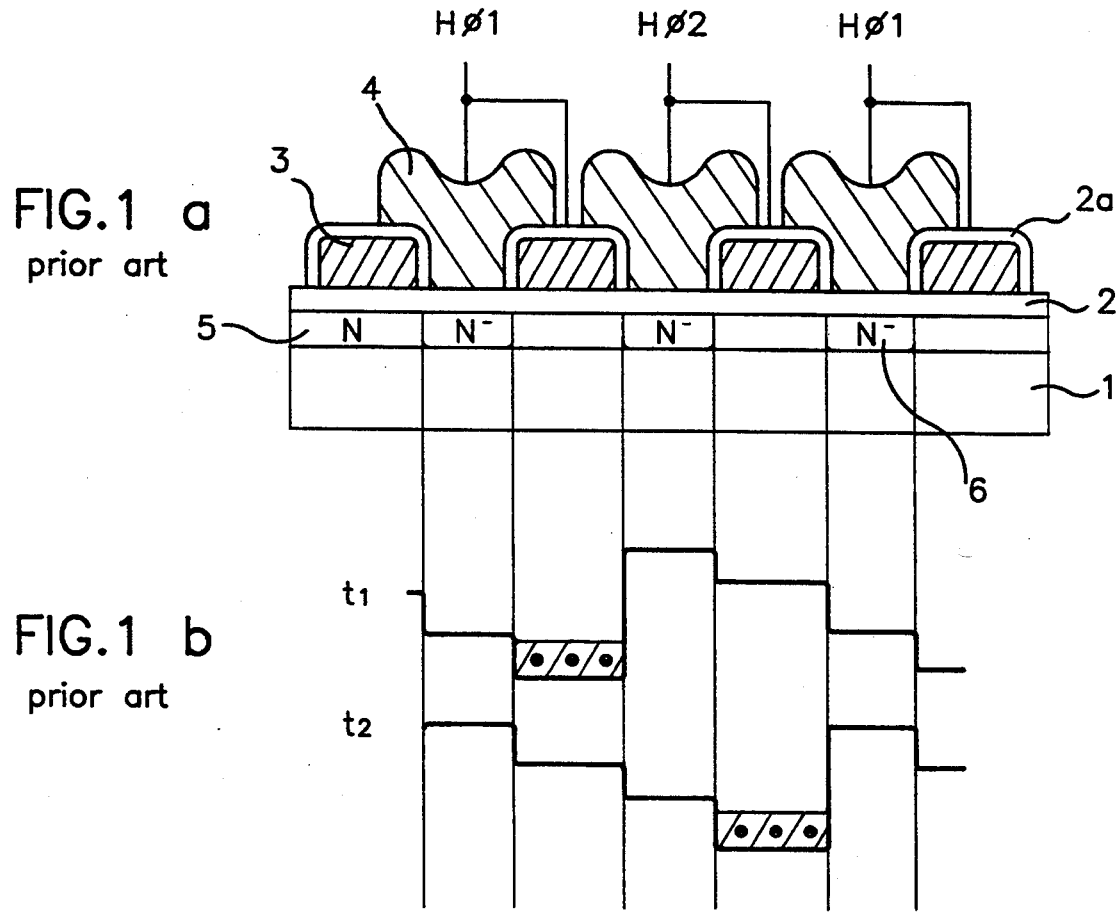
FIG.1 a prior art
FIG.1 b prior art
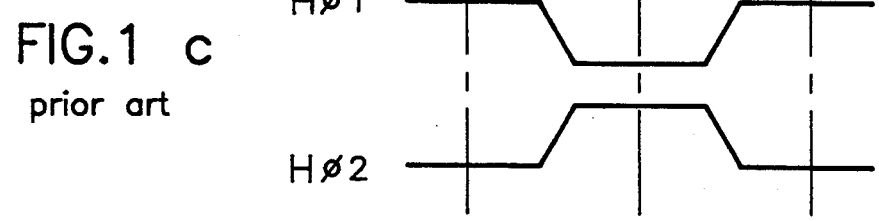
FIG.1 c prior art

HORIZONTAL CHARGE COUPLED DEVICE

BACKGROUND OF THE INVENTION

The present invention relates to a charge coupled device image sensor, and more particularly to a horizontal signal charge transfer device capable of operating at high speed.

Charge coupled device (CCD) image sensors typically include a silicon or other semiconductor substrate, an optical-electrical conversion region for generating charges corresponding to a image signal in which a plurality of optical-electrical conversion devices (for example, photodiodes) for converting an optical signal into an electrical signal are arranged in a matrix formation, a plurality of vertical charge coupled devices (VCCD) for transferring image signal charges generated by the optical-electrical conversion devices in a single vertical direction and formed in the single vertical direction with constant spacing between the optical-electrical conversion devices, a horizontal charge coupled device (HCCD) formed at the output sides of the VCCDs to transfer image signal charges transferred from the VCCDs in a horizontal direction, and a sensing amplifier for sensing image signal charges transferred from the output side of the HCCD.

A conventional HCCD of the CCD image sensor will hereinafter be described in conjunction with the accompanying drawings. FIG. 1a is a sectional view showing the structure of the conventional HCCD. FIG. 1b is a diagram showing potential profiles in the structure of FIG. 1a. FIG. 1c is a clock timing diagram for transferring signal charges in the structure shown in FIG. 1a.

Referring to FIG. 1a, the conventional HCCD comprises a n-type silicon substrate, a p-type well 1 formed in the surface of the n-type silicon substrate, an n-type buried CCD (BCCD) 5 formed in the surface of the p-type well 1 to transfer signal charges, an insulation film 2 formed on BCCD 5, a plurality of equally spaced first charge transfer electrodes 3 of n-type semiconductor formed on the insulation film 2 to apply the clock signals shown in FIG. 1c, and a plurality of second charge transfer electrodes 4 of n-type semiconductor formed between the plurality of first charge transfer electrodes 3 and isolated electrically from the first charge transfer electrodes 3 by insulation film layer 2a.

Two clock signals $H0_1$, $H0_2$ are alternately applied to a plurality of electrode pairs where each electrode pair comprises a first charge transfer electrode 3 and an adjacent second charge transfer electrode 4. One clock signal $H0_1$ always has an inverted level with respect to that of the other clock signal $H0_2$.

In the conventional HCCD shown in FIG. 1a, p-type ions are implanted in the BCCD region 5 below the second charge transfer electrodes 4, using the first charge transfer electrodes 3 as a mask, before the formation of the second charge transfer electrodes 4. A plurality of barrier layers 6 having a low concentration are thereby formed.

The operation of the conventional HCCD with the above-mentioned construction will hereinafter be briefly described. As shown in FIG. 1c, when the clock signals $H0_1$, $H0_2$ are alternately applied to the plurality of electrode pairs in which each pair comprises a first charge transfer electrode 3 and an adjacaent second charge transfer electrode 4, the HCCD has step-shaped potentials, thereby enabling signal charges to be moved in a single direction. Although one of the clock signals $H0_1$, $H0_2$ is simultaneously applied to a first charge transfer electrode 3 and an adjacent second charge transfer electrode 4, the HCCD always has step-shaped potentials since the plurality of barrier layers 6 are formed in the BCCD region 5 at locations below the lower parts of associated second charge transfer electrodes 4. The signal charges are therefore transferred in a single direction if the clock signals $H0_1$, $H0_2$ are alternately applied to the first charge transfer electrodes 3 and the second charge transfer electrodes 4.

As mentioned above, the conventional HCCD manufacturing technique involves implanting impurity ions additively in the BCCD channel 5 to form the barrier layers 6 which make the step-shaped potentials in the HCCD upon the application of clock signals $H0_1, H0_2$. It is, however, easy for the signal charges to be trapped in the barrier layers 6, due to the implanted impurity ions, when the signal charges are transferred in a single direction. Unfortunately; this trapping of the signal charges causes a deterioration of the charge transfer efficiency (CTE).

SUMMARY OF THE INVENTION

It is an object of the present invention to provide a signal charge transfer device capable of operating at high speed with increased CTE. In accordance with one aspect of the present invention, there is provided a signal charge transfer device comprising a well of a first conductivity-type, a channel region of a second conductivity-type formed on the well of the first conductivity-type, and a gate insulation film formed on the channel region of the second conductivity-type. A plurality of first charge transfer electrodes of the second conductivity-type are formed on the gate insulation film with a constant distance between each other. A plurality of second charge transfer electrodes of the first conductivity-type are formed between the plurality of first charge transfer electrodes, and are isolated electrically from the first charge transfer electrodes.

BRIEF DESCRIPTION OF THE DRAWINGS

The above and other objects, features and advantages of the present invention will be more clearly understood from the following detailed description in conjunction with the accompanying drawings, in which:

FIG. 1a is a sectional view showing the structure of a conventional HCCD;

FIG. 1b is a diagram showing potential profiles in the structure of FIG. 1a;

FIG. 1c is a clock-timing diagram for transferring signal charges in the structure of FIG. 1a;

FIG. 2a is a sectional view showing the structure of a HCCD according to the present invention;

FIG. 2b is a diagram showing potential profiles in the structure of FIG. 2a; and FIG. 2c is a clock-timing diagram for transferring signal charges in the structure of FIG. 2a.

DETAILED DESCRIPTION OF THE INVENTION

The present invention involves constructing a HCCD having first charge transfer electrodes and second charge transfer electrodes such that they have conductivity types different from each other, without implanting impurity ions in a BCCD channel region, to obtain the step-shaped potentials during device operation. Although a clock signal is simultaneously applied to the first charge transfer electrode and an adjacent second charge transfer electrode which form a pairs the BCCD channel will have the step-shaped potentials since the adjacent first charge transfer electrode and second charge transfer electrode have different conductivity types.

Figure 2:
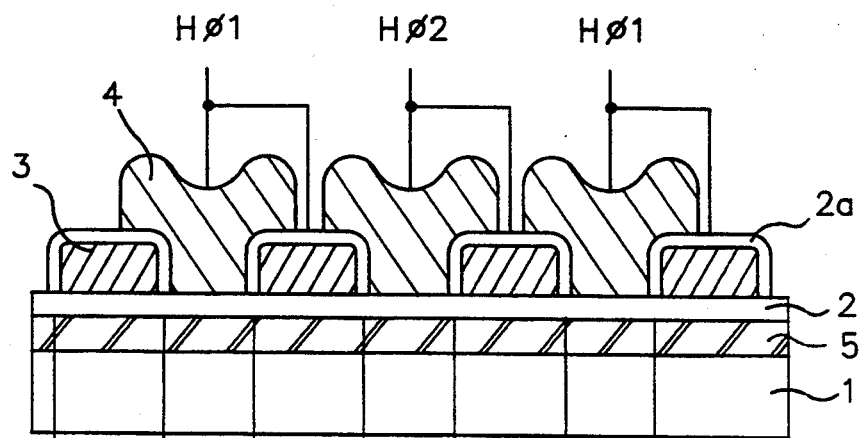
Figure 2:
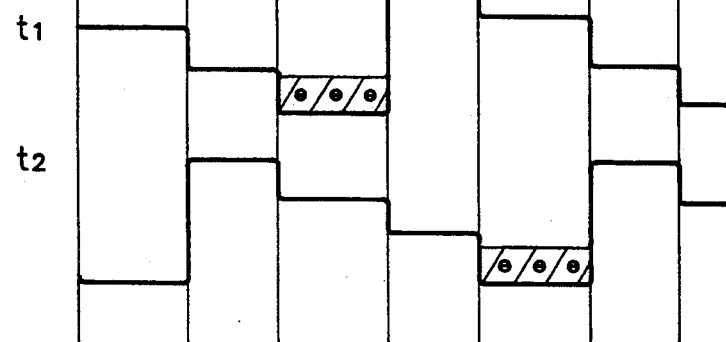
Figure 2:
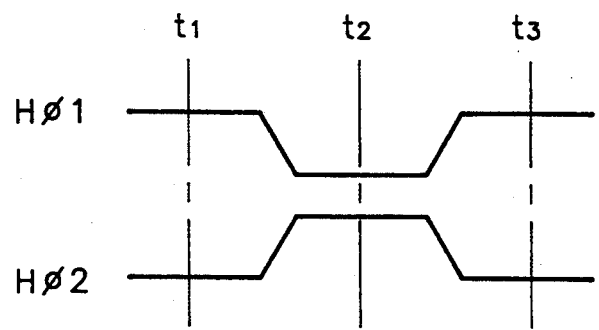

The present invention will hereinafter be described in greater detail in conjunction with the accompanying drawings. FIG. 2a is a sectional view showing the structure of an HCCD in accordance with the present invention. FIG. 2c is a timing diagram for the structure of FIG. 2a. FIG. 2b is a diagram showing potential profiles in accordance with FIG. 2a and FIG. 2c.

As shown in FIG. 2a, an HCCD in accordance with the present invention comprises a silicon substrate, a well 1, formed on the silicon substrate, a BCCD channel regional 5 of n-type formed in the surface of the well 1, for transferring signal charges, a gate insulation film 2 formed on the BCCD channel region 5, a plurality of first charge transfer electrodes 3 formed with a constant distance between each other on the gate insulation film 2, for applying clock signals shown in FIG. 2c, and a plurality of second charge transfer electrodes 4 formed between the first charge transfer electrodes 3 and isolated electrically from the first charge transfer electrodes by an insulation film 2a.

The second charge transfer electrodes 4 are made of a polysilicon of p-type.

Each first charge transfer electrode 3 forms a pair with an adjacent second charge transfer electrode 4. Two clock signals $H0_1$, $H0_2$ are alternately applied to the plurality of the electrode pairs.

A method for making a horizontal charge transfer device (HCCD) in accordance with the present invention will hereinafter be described in conjunction with FIG. 2a. First, impurity ions of p-type (for example, B+: boron) are implanted in the surface of a silicon substrate of n-type, to form a well 1 of p-type. Thereafter, impurity ions of n-type (for example, p+: phosphorous) are implanted in the surface of the well 1 of p-type, so as to form a BCCD channel region 5 in the surface of the well 1. Subsequently, a gate insulation film 2 such as an oxide film is formed on the BCCD channel region 5, and then a polysilicon of n-type is deposited on the gate insulation film 2 using a chemical vapor deposition (CVD) method.

Thereafter, the polysilicon of n-type is patterned, using a photolithography process and an etch method, to form a plurality of equally spaced first charge transfer electrodes 3. Subsequently, an insulation film 2a is deposited over the exposed whole surfaces of the first charge transfer electrodes 3 and the gate insulation film 2 with a CVD method. Thereafter, a polysilicon of p-type is deposited with a CVD method on the insulation film 2a, and then the polysilicon of p-type is patterned with a photolithography process and an etch process to form a plurality of second charge transfer electrodes 4 between the plurality of first charge transfer electrodes 3.

The operation of the HCCD in accordance with the present invention will hereinafter be described. Since the first charge transfer electrodes 3 and the second charge transfer electrodes 4 are doped with impurity ions having conductivity-types different from each other, instead of having barrier layers in the BCCD channel region 5 (as shown in FIG. 1a), the BCCD channel region 5 has step-shaped potentials upon the alternate application of the two clock signals $H0_1$, $H0_2$ shown in FIG. 2c. It is therefore possible for signal charges to be moved in a single direction, as shown in FIG. 2b.

As mentioned above, the present invention forms the first charge transfer electrodes and the second charge transfer electrodes such that they have conductivity-types different from each other, instead of forming a plurality of barrier layers by implanting impurity ions in the BCCD channel region 5, so as to have the step-shaped potentials in the BCCD channel region 5. Trapping of the signal charges in the barrier layers is thereby prevented. This results in more efficient transfer of the signal charges than in conventional signal charge transfer devices.

Although the present invention has been described with reference to preferred embodiments, those skilled in the art will recognize that changes may be made in form and detail without departing from the spirit and scope of the invention.

What is claimed is:

1. A signal charge transfer device comprising:
   a well of a first conductivity type;
   a channel region of a second conductivity type formed on the well of the first conductivity type;
   a gate insulation film formed on the channel region of the second conductivity type;
   a plurality of equally spaced first charge transfer electrodes of the second conductivity type formed on the gate insulation film;
   a plurality of second charge transfer electrodes of the first conductivity type formed between the plurality of first charge transfer electrodes; and
   an insulation film for electrically isolating the plurality of first charge transfer electrodes from the plurality of second charge transfer electrodes.

2. A signal charge transfer device in accordance with claim 1, wherein the plurality of first charge transfer electrodes and the plurality of second charge transfer electrodes are made of a polysilicon.

3. The signal charge transfer device of claim 1 and further including conductors for electrically interconnecting each first charge transfer electrode to an adjacent second charge transfer electrode.

4. A charge coupled device image sensor including a horizontal signal charge transfer device in accordance with claim 1.

5. The signal charge transfer device of claim 1 and further including conductors for coupling clock signals to the first and second charge transfer electrodes.

* * * * *